(12) United States Patent
Aton et al.

(10) Patent No.: US 7,984,393 B2
(45) Date of Patent: Jul. 19, 2011

(54) SYSTEM AND METHOD FOR MAKING PHOTOMASKS

(75) Inventors: Thomas J. Aton, Dallas, TX (US); Carl A. Vickery, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 569 days.

(21) Appl. No.: 11/940,016

(22) Filed: Nov. 14, 2007

(65) Prior Publication Data
US 2009/0125870 A1 May 14, 2009

(51) Int. Cl.
G06F 17/50 (2006.01)
(52) U.S. Cl. .......................... 716/54; 716/55
(58) Field of Classification Search ............ 716/19–21, 716/54, 55; 430/5, 30, 394
See application file for complete search history.

(56) References Cited

U.S. PATENT DOCUMENTS

| | | | |
|---|---|---|---|
| 6,764,795 B2 | 7/2004 | Aton et al. | |
| 7,435,512 B2 * | 10/2008 | Chang | 430/5 |
| 2005/0106473 A1 * | 5/2005 | Huang | 430/5 |
| 2006/0210889 A1 * | 9/2006 | Fujimoto | 430/5 |
| 2007/0174802 A1 * | 7/2007 | Shin et al. | 716/8 |

OTHER PUBLICATIONS

Aton, U.S. Appl. No. 11/771,515, filed Jun. 29, 2007.
Aton, U.S. Appl. No. 11/940,990, flied Nov. 15, 2007.
Aton et al., U.S. Appl. No. 11/940,245, filed Nov. 14, 2007.
Aton, U.S. Appl. No. 11/863,753, filed Sep. 28, 2007.
Aton et al., U.S. Appl. No. 11/940,194, filed Nov. 14, 2007.
Aton, U.S. Appl. No. 11/863,717, filed Sep. 28, 2007.
Aton et al., U.S. Appl. No. 11/940,270, filed Nov. 14, 2007.

* cited by examiner

Primary Examiner — Vuthe Siek
(74) Attorney, Agent, or Firm — Warren L. Franz; Wade J. Brady, III; Frederick J. Telecky, Jr.

(57) ABSTRACT

The present disclosure is directed a method for preparing photomask patterns. The method comprises receiving drawn pattern data for a design database, the drawn pattern data describing device circuit features and dummy features. The dummy features have first target patterns. Mask pattern data is generated for the dummy features, wherein one or more of the dummy features have second target patterns that are different from the first target patterns. The mask pattern data is corrected for proximity effects.

7 Claims, 5 Drawing Sheets

*FIG. 8B*

SYSTEM AND METHOD FOR MAKING PHOTOMASKS

FIELD OF THE DISCLOSURE

The present disclosure relates generally to the field of photolithography, and more specifically to a method and system for preparing a pattern for a photomask.

BACKGROUND OF THE DISCLOSURE

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photo-resist film formed on a wafer. The term "chrome" refers to an opaque masking material that is typically but not always comprised of chrome. The transmission of the opaque material may also vary such as in the case of an attenuating phase shift mask.

The process of making the photomask begins by receiving data from a design database. The design database contains data describing at least a portion of an integrated circuit design layout, referred to as the "drawn" pattern, which generally provides a target pattern that the designers wish to achieve on the wafer. Techniques for forming design databases are well known in the art.

After receiving the design database, mask makers form one or more photomasks that can be used to implement the target pattern described by the design data. This mask making process may generally include generating mask pattern data describing initial photomask patterns for forming device features. The initial photomask patterns are formed by employing various resolution enhancement techniques. The resolution enhancement techniques can include splitting the drawn pattern so that it is patterned using two or more photomasks, such as a phase shift mask and a trim mask, for use in a phase shift process (altPSM). Methods for forming such photomask patterns from design data are well known in the art.

After the initial photomask patterns are formed, a proximity correction process is carried out that corrects the mask pattern data for proximity effects. The proximity correction process generally involves running proximity correction software to perform calculations that alter the shape of the initial photomask pattern to take into account proximity effects, such as optical diffraction effects that occur during the imaging process. In this method, a computer simulation program is often used to compute image-like model values that are taken to represent the features formed for a particular photomask feature pattern or group of patterns. Based on these simulated model values, the photomask pattern can be altered and then simulated again to determine if the altered pattern will improve the printed features. This process can be repeated until the result is within desired specifications. The features added to a photomask pattern based on this procedure are called optical proximity correction features.

After proximity correction has been performed, verification of the mask pattern data can be performed. This can include running various quality checks to determine whether the photomask patterns generated will form the desired pattern for implementing the circuit specified in the drawn data. The mask pattern data can then be sent to a mask shop, where the actual photomasks are fabricated from the mask pattern data.

One of the most common commercial implementations of alternating phase shift mask technology is the double exposure method. In this method, the critical device features to be patterned are imaged during a first exposure using a first mask, such as a phase shift mask. The non-critical and other secondary features are imaged in a second exposure using second mask, such as a conventional chrome-on-glass mask. In the past, both the first and second exposures were performed on the same photoresist layer.

More recently, a new process has been developed, referred to herein as two-print/two-etch ("2p/2e") or "double patterning," in which the first exposure and second exposure are each performed on separate photoresists. The patterns from each of the photoresists can be individually transferred to, for example, a hardmask. In some processes, rather than employing a hardmask, the first and second patterns from the first and second exposures can be transferred directly to the wafer in two separate etch steps.

In an exemplary 2p/2e process, a phase pattern may be formed in a first photoresist. The phase pattern can then be transferred to a hardmask using an etching technique and the first photoresist removed. A trim pattern can then be formed in a second photoresist and the resulting photoresist pattern is then transferred to the hardmask using a second etching step. Subsequently, the hardmask pattern, having both the phase and trim patterns etched therein, can be used to etch the wafer.

As device features continue to shrink, it has become more and more difficult for mask makers to implement the target patterns contained in the design database. These difficulties are generally due to spatial bandwidth constraints of modern lithography systems, and the inherent difficulties associates with forming patterns approaching a nanometer scale (e.g., such as patterns having a critical dimension of 90 nm or less). In the past, these problems have been dealt with by setting appropriate design rules that designers can follow to form a design having target patterns that can be successfully implemented. However, the design rules have become increasingly complex, and often result in complicated patterns in the target design that are difficult or impossible to implement.

Given the overly complicated patterns formed by designers, mask makers are forced to redraw the target patterns to allow them to be implemented, while still maintaining the intended functionality of the circuit design. However this can be a difficult and time consuming process due to the enormous amount of data that must be culled through by the mask makers. The overly complicated designs formed by the designers merely add to the confusion by making it difficult for the mask makers to determine the intended functionality of devices that must be redrawn. In addition, it is becoming more difficult to program the proximity correction software to successfully handle the complicated designs and produce photomask target patterns that will result in the desired target patterns set by the designers.

Accordingly, methods for more efficiently forming target patterns that can be implemented would be desirable improvements in the mask manufacturing process. Methods for improving the communication between circuit designers and mask makers regarding the intended functionality of circuit designs would also be a desirable improvement.

SUMMARY OF THE DISCLOSURE

In accordance with the disclosure, an embodiment of the present teachings is directed a method for preparing photomask patterns. The method comprises receiving drawn pattern data for a design database, the drawn pattern data describing device circuit features and dummy features. The dummy features have first target patterns. Mask pattern data is generated for the dummy features, wherein one or more of the dummy features have second target patterns that are different from the first target patterns. The mask pattern data is corrected for proximity effects.

Another embodiment of the present disclosure is directed to a method for patterning a device. The method comprises providing a substrate. A layer is formed on the substrate and a first photoresist is applied over the layer. The first photoresist is exposed to radiation through a first photomask and the first photoresist is developed to form a first pattern. An etching process is carried out to transfer the first pattern into the layer and the first photoresist is removed. A second photoresist is applied over the layer. The second photoresist is exposed to radiation through a second photomask and the second photoresist is developed to form a second pattern. An etching process is carried out to transfer the second pattern into the layer, and the second photoresist is removed. The first and second photomasks comprise patterns that are prepared by a method that includes forming drawn pattern data for a design database. The drawn pattern data describes dummy features having first target patterns. Mask pattern data is generated for the dummy features, wherein one or more of the dummy features have second target patterns that are different from the first target patterns. The mask pattern data is corrected for proximity effects Another embodiment of the present disclosure is directed to a method for preparing a system of photomask patterns for forming devices having intended electrical characteristics. The method comprises preparing drawn pattern data for a design database, the drawn pattern data describing device features having first edges that define critical dimensions and second edges that define dummy feature dimensions. A first mask pattern is formed for patterning the first edges designed to achieve the critical dimensions. A second mask pattern is formed for patterning the second edges, wherein at least some of the second edges are retargeted so as to alter the dummy feature dimensions in a manner that does not significantly affect the intended electrical characteristics of the device.

Additional objects and embodiments of the disclosure will be set forth in part in the description which follows, and can be learned by practice of the disclosure. It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present disclosure, examples of which are illustrated in the accompanying drawings. Wherever possible, the same reference numbers will be used throughout the drawings to refer to the same or like parts.

The methods of the present teachings allow designers to draw simplified drawn patterns, or placeholder patterns, that do not necessarily include desired target patterns for some device features. Desired target patterns for these drawn patterns can then be determined by retargeting the simplified drawn patterns downstream during the mask making process. As will be discussed in greater detail below, by moving the decision as to what the shape of the desired target pattern should be downstream, a more optimal solution can be found.

Figure 1:
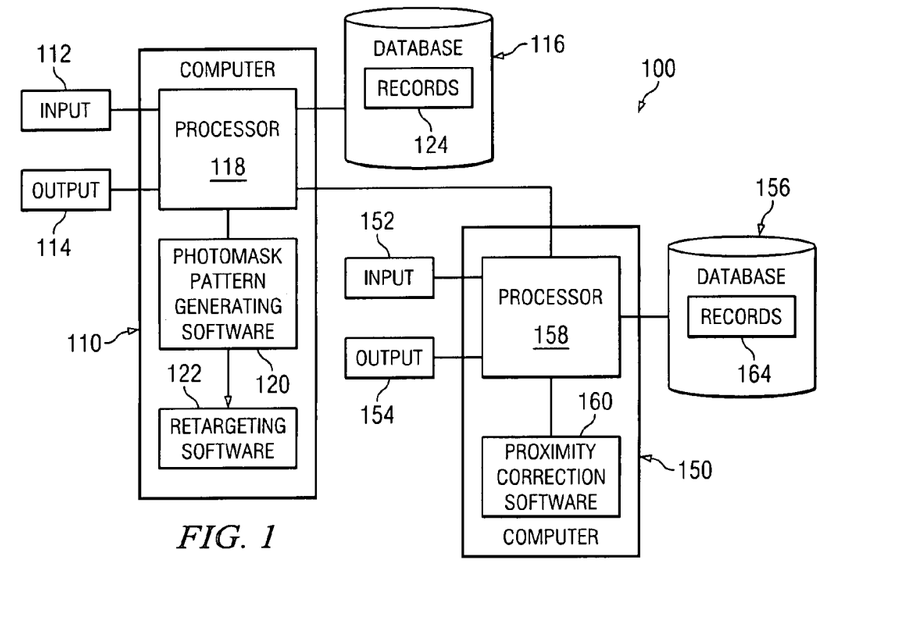
FIG. 1 illustrates a block diagram of a system for forming a photomask pattern, according to an embodiment of the present disclosure.

FIG. 1 illustrates a system 100 for forming a photomask pattern, according to an embodiment of the present disclosure. Any other suitable system for making photomasks may be employed. System 100 includes a first computer 110 and a second computer 150. Input devices 112, 152 and output devices 114, 154 are respectively coupled to computers 110 and 150, which are in turn respectively coupled to databases 116, 156, as shown in FIG. 1. Input devices 112, 152 may comprise, for example, a keyboard, a mouse, and/or any other device suitable for inputting and manipulating data to the respective computers 110 and 150. Output devices 114, 154 may comprise, for example, a display, a printer, and/or any other device suitable for presenting data from the respective computers 110 and 150.

Computers 110 and 150 can be personal computers, workstations, networked computers, or any other suitable processing platform. Computers 110 and 150 may include processors 118, 158, as shown in FIG. 1. The processor 118, 158 can be implemented using at least one microprocessor from vendors such as Intel, Advanced Micro Devices, Transmeta, IBM, or other circuit manufacturers. In addition, computer 110 can include photomask pattern generation software 120. Computer 150 can include a proximity correction software 160.

Photomask pattern generation software 120, retargeting software 122 and proximity correction software 160 can exist as computer readable instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 118 can be configured to control the flow of data between input device 112, output device 114, database 116, and photomask pattern generation software 120. Photomask pattern generation software 120 and retargeting software 122 may receive descriptions of integrated circuit device features from database 116. Database 116 can include drawn pattern data describing device features, including at least one or more dummy features having first target patterns. Photomask pattern generation software 120 can form photomask patterns that include dummy feature patterns from the drawn pattern data. Retargeting software 122 can be employed to retarget one or more of the dummy feature patterns to have second target patterns that are different from the first target patterns. In embodiments, retargeting can be performed by code implemented into the photomask pattern generation software 120.

Mask pattern data can be generated by photomask pattern generation software 120. Once the mask pattern data is prepared, processor 118 can transfer the mask pattern data to computer 150 for further processing. The computers 110, 150 can be coupled together over a network (not shown). The network can be a local area network, a wide area network or a combination thereof. The communication protocol between the computers 110, 150 can be implemented with IEEE802.x, token ring, or any other network protocol.

Processor 158 of computer 150 can be configured to control the flow of data between input device 152, output device 154, database 156, and proximity correction software 160. Proximity correction software 160 can be configured to process the mask pattern data received from computer 150. Specifically, proximity correction software 160 performs a proximity correction process that corrects the mask pattern data for proximity effects.

Databases 116, 156 may comprise any suitable system for storing data. Databases 116, 156 can be implemented using database technologies from Oracle, Sybase, MySQL, Cadence, or any other database vendors, including databases in any desired format, such as GDSII format or OASIS. Database 116 can store records 124 (data or files) that comprise data associated with the integrated circuit device features and the photomask patterns to be generated, such as design data and mask pattern data, as will be described in greater detail below. Database 156 may store records 164 (data or files) that comprise data associated with the proximity correction process, such as, for example, the mask pattern data transferred from computer 110.

Figure 2:
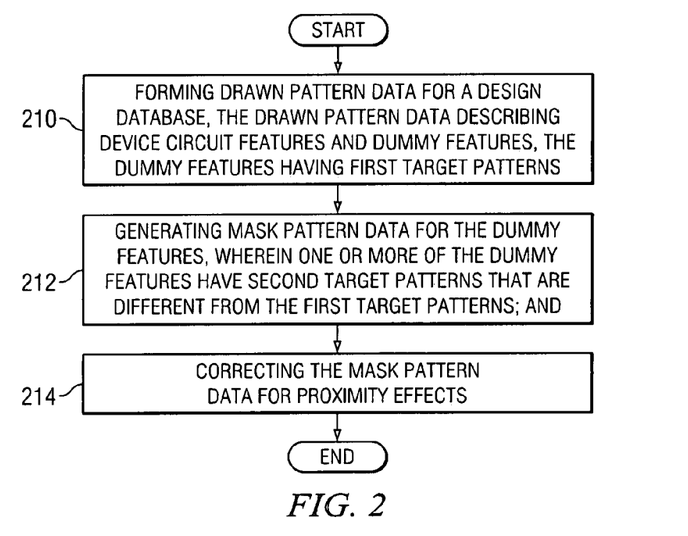
FIG. 2 illustrates a flow diagram of an embodiment of a process for making photomasks, according to the present disclosure.

FIG. 2 illustrates a flow diagram 200 of an embodiment of a process for making photomasks according to the present disclosure. It should be readily apparent to those of ordinary skill in the art that the flow diagram 200 depicted in FIG. 2 represents a generalized schematic illustration and that other steps may be added or existing steps may be removed or modified.

As shown in block 210 of an embodiment of FIG. 2, the process can include forming drawn pattern data for a design database. The drawn pattern data can describe drawn patterns of a plurality of device features for forming an integrated circuit. The term "feature", as used herein, can be broadly interpreted as referring to an element of a device to be patterned, such as a semiconductor device. Examples of a feature can include a gate, a gate bus, a well, an isolation structure, an interconnect line, a space, a contact hole, a pillar, a resistor, a dummy feature, or any other element of a device to be patterned.

In embodiments of the present disclosure, the drawn pattern data can include data describing one or more dummy features, as well as device circuit features, such as gates and metallization structures. The term dummy feature is generally well known in the art, and includes features formed on a substrate that are not considered an electrically functional part of the circuit. At least a portion of the dummy features remain on the finished wafer. The term dummy feature, as used herein, can be broadly interpreted as referring to an electrically non functional structure used to improve critical dimension control. For example, a dummy feature, such as a dummy gate, can be formed at the end of an array of gates so that the environment of the gates at the end of the array is similar to the environment of the gates in the interior of the array during lithography and/or etching processes. In this manner, dummy features can be used to reduce the critical dimension variation of the gates at the end of the array as compared with the critical dimention variation that would occur if the dummy features were not employed.

The term "critical dimension" is defined herein as a dimension of a pattern feature that must be within design tolerances in order to maintain device performance consistency. For example, in one embodiment where the drawn pattern includes gate features, the critical dimension can be gate lengths of the gate features. In another embodiment, the critical dimension can be the width of metallic lines in a metallization structure.

Drawn patterns that are used to generate photomasks generally include a plurality of polygon shaped patterns. The edges of these polygon patterns define desired device dimensions of, for example, an integrated circuit design to be fabricated. Each edge of the drawn pattern can be assigned a level of importance. Some pattern edges will be used to define critical dimensions of the integrated circuit design, such as, for example, a gate length or possibly some interconnect widths or active region boundaries. Other pattern edges may be used to pattern non-critical dimensions, such as dummy features that are not a functional part of the device, or a dimension of a device circuit feature that is not considered a critical dimension. The non-critical edges, which are considered less important than the critical edges, can be adjusted by the mask makers in order to improve lithographic patterning.

As will be discussed in greater detail below, the dummy features, of the present disclosure can be drawn using relatively simple design rules. These design rules can be chosen to provide placeholder target patterns which provide a desired pattern pitch and allocate approximate wafer real estate that is to be used for the non-critical features. However, the placeholder target patterns do not necessarily provide a desired target pattern. Instead, the target patterns for these placeholder geometries may subsequently be provided during a retargeting process that is carried out during the mask making process.

After the design database formed in 210 of FIG. 2 is completed, it can be transferred to the mask makers. The mask makers use the design data to make one or more photomasks for implementing the integrated circuit design described in the design database. As indicated in block 212 of FIG. 2, this mask making process may generally include generating mask pattern data, including mask pattern data for the circuit feature and/or dummy feature patterns described by the design data that has been received.

One or more of the photomask feature patterns can have second target patterns that are different from the corresponding target patterns of the drawn pattern. The photomask target pattern may be different than the drawn target pattern described in the design database due to alterations made during the mask pattern generation process and/or retargeting process performed by software 120 and/or 122 of FIG. 1. The retargeting process can include reducing or extending one or more dimensions of the dummy feature target patterns relative to the dimensions of the corresponding dummy feature placeholder target patterns in the drawn pattern. In some instances, it may be determined that a drawn pattern dummy feature does not need to be altered, in which case, the photomask target pattern can reflect the dimensions of the corresponding drawn target pattern for that dummy feature.

The term "target pattern" is defined herein as a desired shape of the pattern to be formed on the substrate (e.g., the wafer in semiconductor processing). As one of ordinary skill in the art would readily understand, the target pattern is not necessarily identical to the pattern formed on the photomask, or for that matter, the pattern that is actually realized on the substrate. Differences between the target patterns and the photomask patterns can be due, at least in part, to various changes made to the mask pattern during processing, such as optical proximity corrections, which allow the target pattern to be more closely achieved on the substrate, as described herein. Differences between the target patterns and the patterns finally formed on the wafer can be due to various photolithographic and etching process imperfections, for example.

The process of retargeting, or reshaping, the dummy feature photomask patterns can be performed at any time during the photomask pattern forming process. In one embodiment, generating the photomask pattern data can include generating retargeted photomask patterns using the photomask pattern generation software 120 of FIG. 1. The photomask pattern generation software can output photomask patterns based on the drawn pattern data, while taking into account the limitations of the lithographic system and simultaneously making changes to the photomask patterns relative to the drawn pattern data that can result in improved implementation of the general circuit design. If desired, the drawn target pattern data can then be updated to include second target patterns that reflect these changes using, for example, the retargeting software 122 of FIG. 1. In another embodiment, retargeting the dummy feature photomask patterns can include retargeting the drawn target pattern of the dummy features to provide a second target pattern. Then a photomask pattern can be generated based on the retargeted drawn pattern data.

In addition to retargeting the dummy patterns, some embodiments of the present disclosure can include retargeting portions of the drawn pattern other than the dummy features, including device circuit features, such as contact wiring or gate features. For example, in some instances it may be determined that the drawn pattern may be difficult or impossible to pattern given the constraints of the lithography system being employed. In such instances, it may be desirable to redraw the drawn pattern to account for these lithography restraints, while achieving the intended functionality of the circuit design. Such retargeting of the drawn pattern can occur at any suitable time in the photomask pattern forming process, including during the initial generation of the photomask patterns or during the proximity correction process.

Resolution enhancement techniques that may be employed include splitting the drawn pattern so that it is patterned using two or more photomasks. For example, a first photomask pattern and second photomask pattern can be used to implement the drawn pattern data. The first and second photomask patterns can be patterns for making any type of photomask, including a phase shift mask for use in a phase shift process (altPSM), binary mask, embedded attenuated phase shift mask, hard phase shift mask, double-dipole exposure mask, or any other suitable type of mask. In one embodiment, the first mask is a phase shift mask and the second mask is a binary mask. In another embodiment, both first and second masks can be embedded attenuated phase shift masks. Methods for forming such masks from design data are well known in the art, and any suitable method for forming such masks may be employed. In an embodiment, the first and second mask patterns are generated using software programs designed to read data from the design database and prepare appropriate patterns for forming the masks used to make the integrated circuit designs described in the database. One example of a suitable software program is IN-PHASE, which is available from SYNOPSYS, Inc., having corporate headquarters located in Mountain View, Calif.

Yet another example of resolution enhancement techniques for forming the initial photomask patterns may include the formation of sub-resolution assist features (SRAFs). Techniques for forming SRAFs are well known in the art.

In order to more closely achieve the desired mask target pattern, the initial photomask pattern of block 212 is corrected for proximity effects in a proximity correction process, such as is shown in block 214. The proximity correction process generally involves implementing proximity correction software that performs calculations that alter the shape of the photomask pattern to take into account proximity effects, such as optical diffraction effects that occur during the imaging process. Any suitable technique for correcting for proximity effects may be employed. One example of a known proximity correction process is disclosed in U.S. Pat. No. 6,764,795, issued on Jul. 20, 2004 to Aton et al., the disclosure of which is herein incorporated by reference in its entirety.

After correction of the initial photomask pattern for optical proximity effects in block 214, the mask pattern data can be put through a verification process to insure that it meets desired quality standards, and is otherwise prepared for manufacturing, or writing, of the photomask. For example, the mask pattern data may be fractured, which puts the data in a form which is compatible with the mask writing process. The data fracture process may be accomplished using any suitable software program. One example of a suitable software program known in the art for mask data fracturing is CATS, which is available from SYNOPSYS, Inc.

Once the preparation of the mask data is complete, the data can then be used to write the photomasks. Often the mask pattern data is sent to a mask shop, where actual production of the photomasks occurs. Any suitable technique for writing the photomask may be employed. Suitable techniques for writing masks are well known in the art.

In one embodiment, the processes of preparing the design database of block 210, generating the mask pattern data of block 212 and performing the proximity correction process of block 214 can be performed on separate computers. In other embodiments, one or more of the process depicted in FIG. 2 can be performed on a single computer. For example, in one embodiment, the processes of generating the mask pattern data and performing proximity correction can be performed on the same computer.

Figure 3:
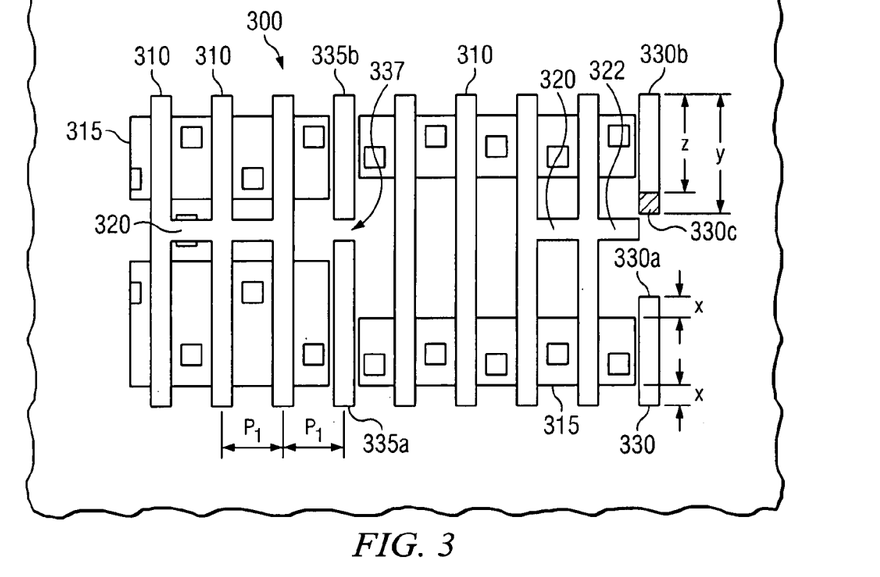
FIG. 3 illustrates a drawn circuit layout, according to an embodiment of the present disclosure.

An embodiment of a method for preparing a system of photomask patterns employing the teachings of the present disclosure will now be described with reference to FIGS. 3 to 6. FIG. 3 illustrates one example of a drawn circuit layout 300, according to an embodiment of the present disclosure. The circuit layout includes conductive feature patterns, such as gate structure patterns 310 formed over active region patterns 315. Interconnects 320 can provide electrical connection between some of the gate structures, as is well known in the art.

Dummy features 330 and 335 are also illustrated in FIG. 3. In an embodiment, the purpose of the drawn dummy feature patterns can be to establish a desired pattern pitch, $P_1$, between the pattern features, including gate features 310 and dummy features 330, 335. In addition, the drawn dummy features allocate approximate wafer real estate that may be employed for the dummy features once they are retargeted. Thus, the drawn dummy features are symbolic in nature, in that they do not necessarily represent a desired desired target pattern, but basically function as placeholders to communicate desired information regarding certain design parameters, such as pitch and the general positioning of the feature on the wafer.

The dummy features are formed by the designers according to a set of design rules. The design rules provide relatively simple guidelines regarding the size and positioning of the dummy features relative to the other device features. One exemplary design rule can provide that the dummy features are to be drawn so that they extend a certain distance past active regions 315. Thus, as illustrated in FIG. 3, each end of dummy feature 330a extends a distance, X, past the adjacent active region 315. Because dummy feature 330a can be retargeted during the mask making process, distance X can literally be chosen to be any desired length that is practical for mask drawing purposes. For example, X could be 0 nm, 10 nm, 50 nm or 100 nm, or any other desired length.

The dimensions disclosed for X, as well as any other pattern dimensions disclosed herein unless otherwise expressly stated, are based upon the size of the pattern to be formed on the wafer. The actual dimensions for X for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger than the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

Figure 4:
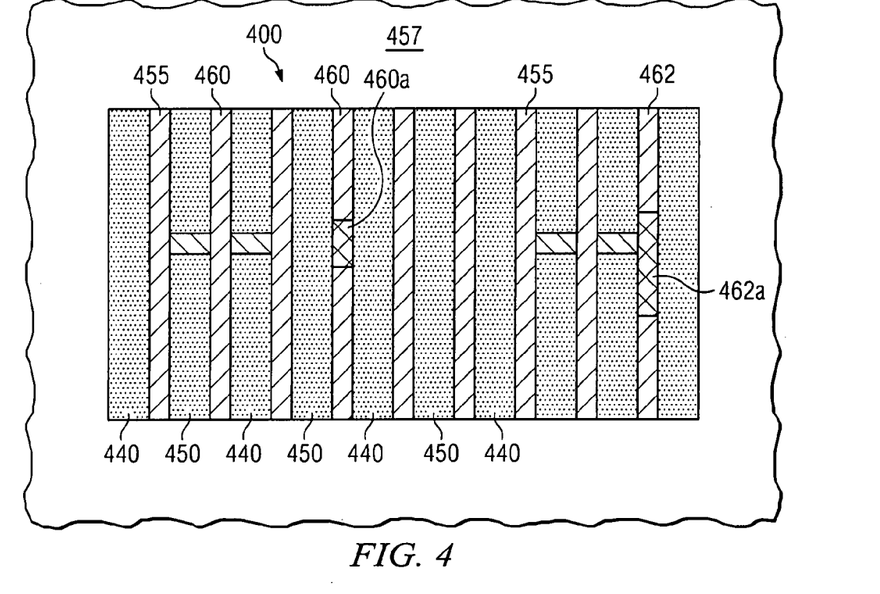
FIG. 4 depicts an exemplary photomask pattern that may be formed in a mask making process for implementing the drawn pattern of FIG. 3, according to an embodiment of the present disclosure.

FIG. 4 depicts an exemplary photomask pattern that may be formed in a mask making process for implementing the drawn pattern of FIG. 3. FIG. 4 is a top view of a portion of a first mask pattern 400 that may be used, for example, to form a poly level gate structure. In an embodiment, mask pattern 400 can be a phase shift mask including a plurality of phase shift patterns. In other embodiments, mask pattern 400 can be a pattern for making any of the other suitable types of masks, such as those described above. The phase shift mask pattern 400 can include patterns for clear 0 degree phase areas 440 and clear 180 degree phase areas 450. Generally, 0 degree phase areas 440 are disposed adjacent to 180 degree phase areas 450. These clear phase shift areas allow light to pass through such that destructive interference occurs at the boundary between the areas. For example, 180 degree phase areas 450 can have a thickness so that it creates destructive interference at its boundary with 0 degree phase areas 440.

As is well known in the art, the areas between the phase patterns 440 and 450 represent opaque areas 455 and 460 that will be covered with an opaque material, such as chrome, during the mask manufacturing process. Opaque areas 455 correspond to drawn gate pattern features 310 of FIG. 3; and opaque areas 460 and 462 correspond to drawn dummy feature patterns 335 and 330 of FIG. 3. Methods and techniques for forming phase shift masks employing the phase mask patterns 400 are well known in the art.

First mask pattern 400 can further include a second opaque area 457 that covers the remainder of the portion of first mask area 400. During device manufacture, second opaque area 457 can, for example, protect an underlying photoresist layer from exposure.

Figure 8A:
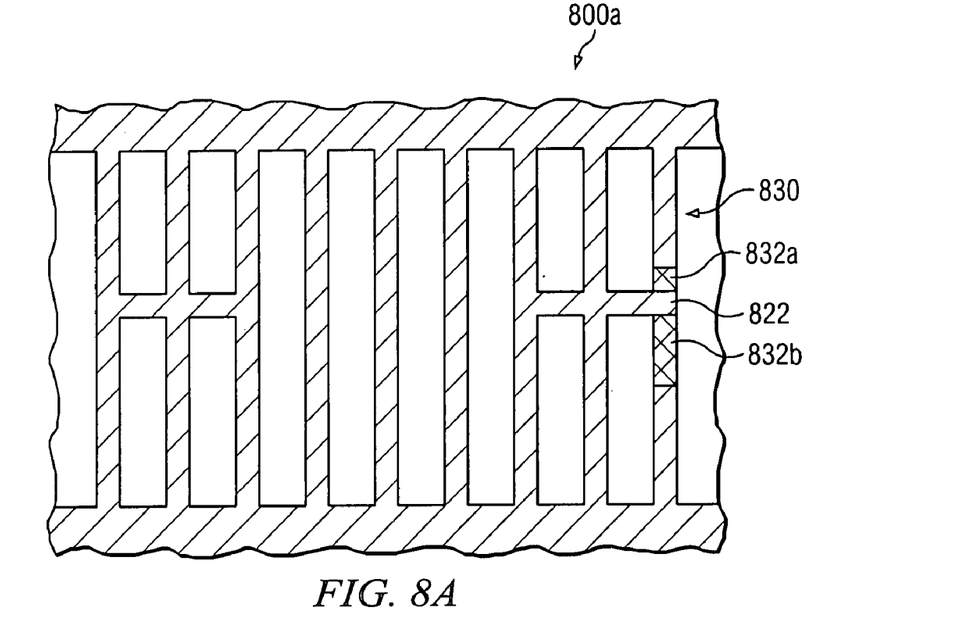
FIG. 8A illustrates a pattern formed on a substrate using a photomask made with the photomask pattern of FIG. 4, according to an embodiment of the present disclosure.

As shown in FIG. 4, phase patterns 440 and 450 are positioned to form long, relatively uninterrupted vertical edges, including in areas 460a and 462a, shown with the crisscrossed hatching in FIG. 4, where the drawn pattern shows gaps in dummy features 330 and 335. When a photomask with the pattern of FIG. 4 is employed to pattern a substrate, the phase pattern 400 will result in a substrate pattern 800a where the dummy features are connected, as illustrated in FIG. 8A.

A second mask, which in this example is referred to as a trim mask, can then be used to provide the desired gaps in pattern 800a. In this example, the trim mask pattern can be designed for a binary mask. However, in other embodiments, the trim mask pattern can be designed for any suitable type of mask, such as an embedded attenuate phase shift mask, or any of the other types of masks described herein.

Figure 5:
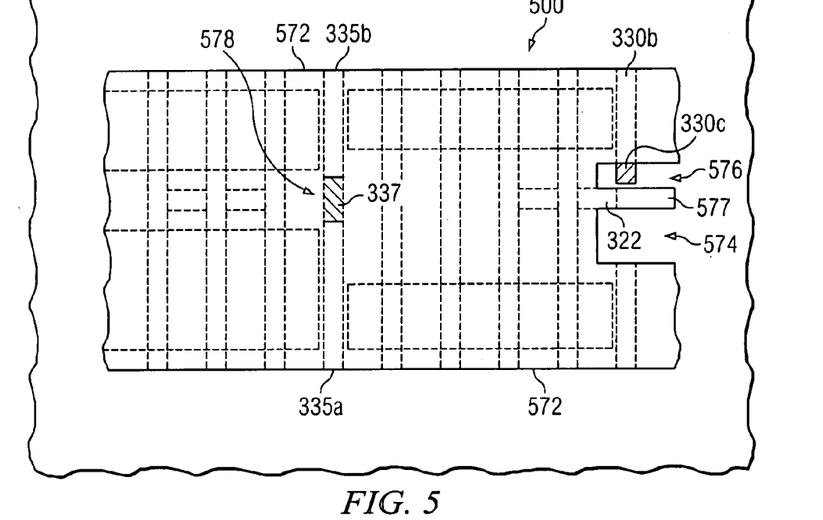
FIG. 5 illustrates an example of a trim mask that may be formed in a mask making process that effectively alters the drawn pattern of FIG. 3, according to an embodiment of the present disclosure.
Figure 8B:
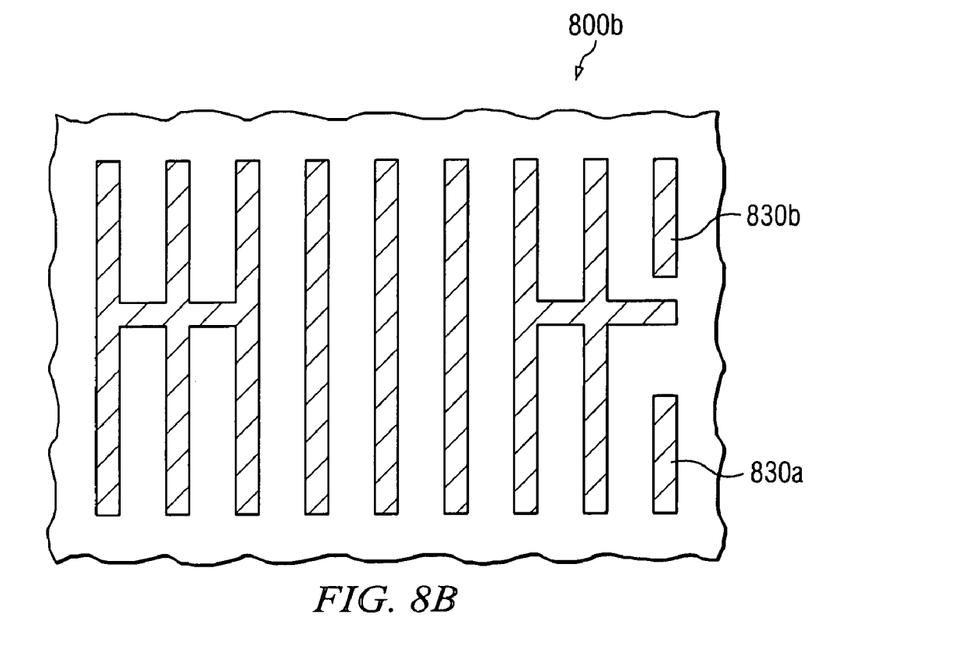
FIG. 8B illustrates a pattern formed on a substrate using both the photomask patterns of FIGS. 4 and 5, according to an embodiment of the present disclosure.

FIG. 5 illustrates an example of a trim mask 500. An embodiment of the trim mask 500 includes an opaque region 572 that is designed to cover the majority of the active area. During resist patterning, opaque region 572 protects an underlying photoresist layer from exposure so that so that it will remain on the substrate to protect the active areas of the substrate. Openings 574 and 576 are formed in the opaque region 572 to cut apart the pattern 830 of FIG. 8A by removing the portions 832a and 832b of the substrate pattern 800a formed using the phase pattern 400 of FIG. 4. In this manner, patterns 830a and 830b, as shown in FIG. 8B, can be formed, which correspond to the drawn pattern dummy feature patterns 330a and 330b of FIG. 3.

However, the opening 576 of FIG. 5 is not necessarily positioned or sized in the trim mask 500 according to the target pattern specifications of the drawn pattern layout. Instead, opening 576 is positioned and sized so as to reduce the size of the dummy feature pattern 330b by adjusting the end of the dummy feature by an amount shown by hatched region 330c of FIG. 3. This shortening of dummy feature pattern 330b is carried out because the placeholder geometry assigned in the drawn pattern places the end portion 330c too close to a contact wiring pattern 322. Due to the limitations of the lithography process, this close proximity can potentially result in the failure of the trim mask to cut apart the pattern 830 shown in FIG. 8, thereby undesirably causing an electrical short between the dummy features and the contact region in the finished device.

Thus, in an embodiment of the present disclosure, it is during formation of the mask pattern 500 that the correct size and positioning of gap 576 is determined. Because the software used to form the mask patterns can be programmed to take into account the limitations of the lithographic process for the specific set of conditions involved in the patterning of the dummy feature pattern 330 in close proximity to contact wiring pattern 322, a better solution is more likely to be achieved than if the circuit designers were forced to provide the desired target pattern of the gap in the drawn pattern.

Another example of altering the placeholder geometry provided in the drawn pattern is shown at position 578 of trim mask 500. Here, as seen in FIG. 5, a gap 337 between dummy features 335a and 335b is called for by the drawn pattern. However, in such situations, forming such a small opening in the trim mask can be difficult due to lithographic constraints. And in this case, extending and joining the dummy features 335a and 335b will not significantly alter the intended electrical characteristics of the device as designed in the drawn pattern because the dummy features are electrically inactive. By "not significantly altering the intended electrical characteristics" it is meant that, although the capacitance characteristics of the device may be changed slightly due to, in this case, addition of the conductive material joining dummy features 335a and 335b, the speed or timing closure of the device will not change to a degree that will substantially alter the intended operation of the device. Thus, in an embodiment, the lithographic software can be programmed to recognize this situation and to not form an opening at position 578 of the mask 500, thereby effectively joining dummy feature patterns 335a and 335b to form a single dummy pattern 635, as shown in the new target pattern 600 illustrated in FIG. 6.

Figure 6:
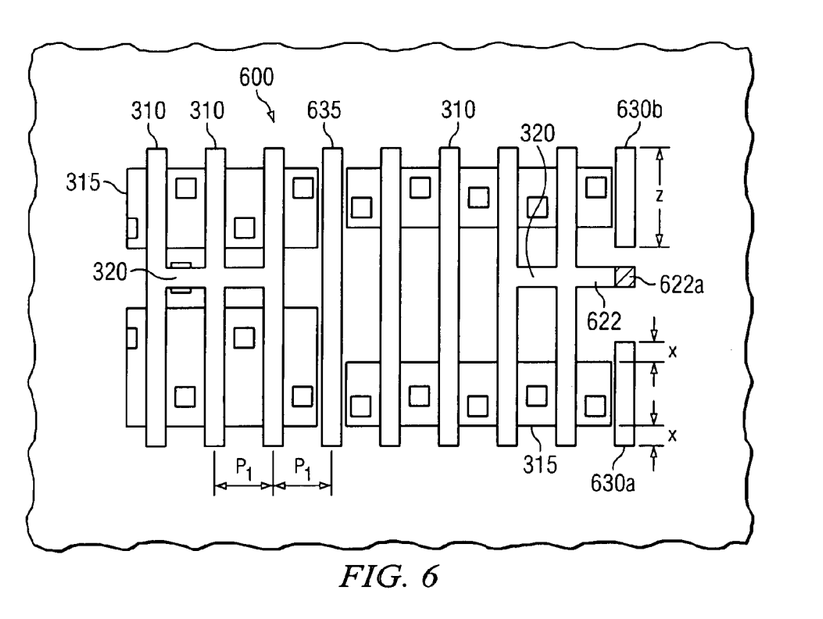
FIG. 6 illustrates a new target pattern resulting from the alterations of the drawn pattern of FIG. 3, according to an embodiment of the present disclosure.

The new target pattern 600 also reflects the changes made to the drawn target pattern due to the placement of openings 574 and 576 in trim mask 500. As shown in FIG. 6, dummy pattern 630b has a longitudinal edge of length, z, which is shorter than the corresponding length, y, of 330b in the drawn target pattern of FIG. 3, according to an embodiment of the present disclosure. Additionally, in an embodiment, contact wiring pattern 622 of the new target pattern may be longer than contact wiring pattern 322 of the drawn target pattern by approximately a gate length, as shown by the hatched region 622a. This additional pattern region 622a may be added by extending the pattern 577 between openings 574 and 576 of the trim mask of FIG. 5 so as to cover more of portion 822 of pattern 800a (see FIG. 8A) than is called for by the drawn pattern of contact wiring pattern 322, as seen in FIG. 3. Extending the contact wiring pattern in this manner can simplify the photomask pattern and improve the printing by ensuring that the contact wire has a sufficient length to make the desired electrical contact. In other embodiments, contact wiring pattern 622 is formed according to the length specified in the drawn pattern.

After the mask patterns of FIGS. 4 and 5 are formed, additional processing can be carried out on the resulting mask pattern data to, for example, correct the mask pattern data for proximity effects. The optical proximity correction process can include sending the mask pattern data, including the target patterns for the pattern data, to an optical proximity correction module 160, as illustrated in FIG. 1. Forming the mask patterns 400 and 500 effectively results in changes to the drawn target pattern, as discussed above. These changes, which are shown in the new target pattern 600 of FIG. 6, may be communicated to the optical proximity correction module. Updating the target pattern data to include these new target patterns can be performed in any suitable manner, such as by software code written into the photomask pattern generation module 120, or by a separate retargeting module 122, as shown in FIG. 1. In an embodiment, the updated data can then be transferred to database 156, where it can be accessed by proximity correction module 160 so that appropriate proximity corrections can then be made based upon the new target patterns.

The new target pattern data can also be sent to other relevant steps along the data processing path. For example, the new target pattern data can be fed back to the circuit designers where it can be checked against the desired drawn pattern to determine if the circuit functionality of the drawn pattern has been changed, and if so, whether these changes are acceptable. The new target pattern data can also be fed forward to the verification process, discussed above, so that the verification process can take into account the new target data when determining whether the mask patterns meet desired quality standards.

Figure 7:
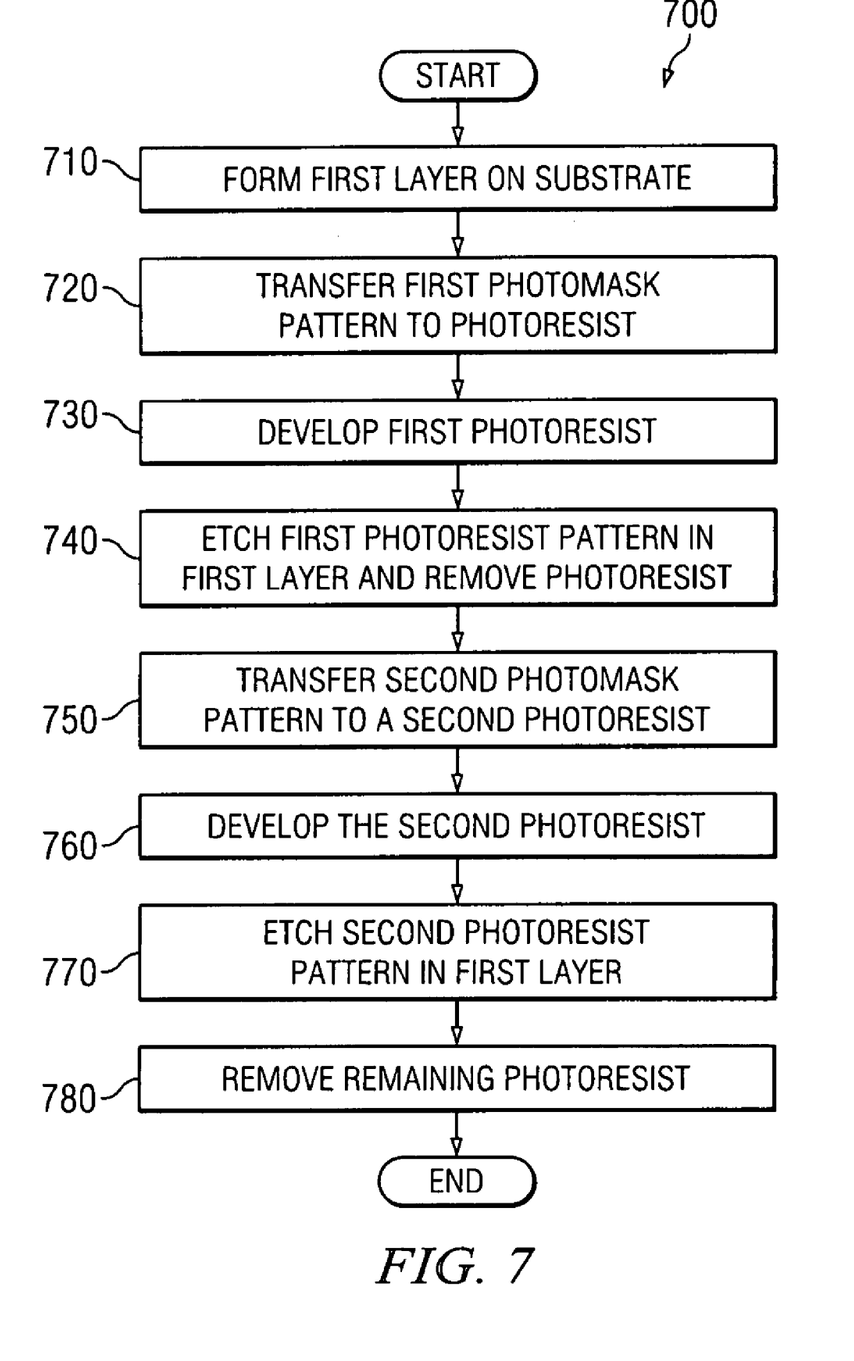
FIG. 7 illustrates a process for forming a semiconductor device using photomasks, according to an embodiment of the present disclosure.

The processes of the present disclosure can be employed to make any suitable type of device that can be manufacturing using lithographic processing. An exemplary method 700 for forming a semiconductor device using the photomasks of the present disclosure is shown in FIG. 7. At 710, a first layer, including one or more of a hardmask and a device layer, can be formed on a substrate. A photoresist layer can be formed on the first layer. At 720, a beam of radiation can be used to transfer the pattern of a first photomask that includes feature patterns, as described in the present disclosure, to the photoresist. For example, a phase shift mask including first pattern 400, shown in FIG. 4, can be used to transfer a phase pattern to the photoresist.

At 730 of FIG. 7, the photoresist with the imaged pattern of the phase shift mask can be developed. This process forms a photoresist pattern (not shown). The photoresist pattern can then be transferred at 740 into the first layer by a first etch. The photoresist can then be removed.

FIG. 8A illustrates an example of a resulting wafer pattern 800a formed in the first layer after the etch 740 of FIG. 7, where a first pattern 400 of FIG. 4 was transferred into the first layer. As shown in FIG. 8A, the wafer pattern 800a includes gate and dummy features having longitudinal edges that are substantially similar to the longitudinal edges of the gate and dummy feature patterns of new target pattern 600 of FIG. 6, except that the dummy features 630a and 630b of FIG. 6 are joined together to form a single pattern 830 (illustrated as including portions 832a, 832b and an end portion of 822) of FIG. 8.

After forming substrate pattern 800a, a second photoresist layer (not shown) is deposited over substrate pattern 800a. Referring again to FIG. 7, a second exposure process can then be used to transfer the pattern of the second mask to the second photoresist at 750. For example, the pattern of second mask 500, as shown in FIG. 5, can be transferred to the photoresist at 750 and the photoresist pattern developed, as at 760 of FIG. 7. The second mask 500 can be aligned with the pattern of FIG. 8A during the second exposure so that the resulting image will result in removal of the desired portions of wafer pattern 800a during the subsequent etch process at 770 of FIG. 7. Following the etch process, the remaining photoresist can then be removed at 780 of FIG. 7.

FIG. 8B illustrates an example of a resulting wafer pattern 800b. Wafer pattern 800b may be substantially similar to the target pattern 600 of FIG. 6, but may include pattern differences that, for example, can occur due to imperfections in the patterning process. As one of ordinary skill in the art would readily recognize, such imperfections may result in, for example, rounded or irregular corners (not shown), whereas the target pattern corners are square.

Referring again to FIG. 7, in some embodiments where the first layer at 710 comprises both a hardmask and a device layer, the gate features and other circuit structure features can be transferred first to the hardmask by exposing two separate photoresists using a first pattern and second pattern, as described above. The hardmask pattern is then transferred to the device layer. Exemplary hardmask materials can include silicon oxynitride, silicon nitride, and silicon oxide, and combinations thereof. Exemplary device layer materials include polysilicon, silicides and metals, and combinations thereof. Alternatively, when a hardmask is not used so that the first layer only includes the device layer, the gate features and the circuit structure features in the photoresist can be transferred directly to the device layer.

The exemplary embodiments of the present disclosure have been performed using a first photomask and a second photomask to implement a drawn pattern. However, one or ordinary skill in the art would readily understand that processes employing three or more photomasks could be employed to implement a drawn pattern using the techniques described in the present disclosure.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for fabricating an integrated circuit device, the method comprising:
    providing a substrate;
    forming a layer on the substrate;
    applying a first photoresist over the layer;
    exposing the first photoresist to radiation through a first photomask and developing the first photoresist to form a first pattern;
    etching to transfer the first pattern into the layer;
    removing the first photoresist;
    applying a second photoresist over the layer;
    exposing the second photoresist to radiation through a second photomask and developing the second photoresist to form a second pattern;
    etching to transfer the second pattern into the layer; and
    removing the second photoresist;
    wherein the first pattern corresponds to drawn design pattern data describing device circuit features and dummy features, the device circuit features having first target patterns and the dummy features having second target patterns; and
    wherein the second pattern corresponds to a trim pattern for modifying the drawn design pattern data and corresponding first pattern, to extend a dimension of at least one first target pattern to provide at least one circuit feature having a third target pattern with the extended dimension and to reduce a dimension of at least one second target pattern to provide at least one dummy feature having a fourth target pattern with the reduced dimension.

2. The method of claim 1, wherein the first target patterns comprise gate circuit feature patterns, the second target patterns comprise gate dummy feature patterns, the third target pattern comprises at least one of the gate circuit feature patterns with an extended dimension, and the fourth target pattern comprises at least one of the gate dummy feature patterns with a reduced dimension.

3. The method of claim 2, wherein the at least one of the gate circuit feature patterns is extended in a direction of elongation, and the at least one of the gate dummy feature patterns is reduced in a direction of elongation.

4. The method of claim 3, wherein the direction of the extension of the at least one of the gate circuit feature patterns is perpendicular to the direction of the reduction of the at least one of the gate dummy feature patterns.

5. A method for producing a lithography photomask set for use in fabrication of an integrated circuit device, the method comprising:
    providing drawn design data describing device circuit features and dummy features of a layer of the integrated circuit device to be formed and patterned;
    forming a first photomask with a pattern corresponding to the drawn design data for patterning the layer with the device circuit features having first target patterns and the dummy features having second target patterns; and
    forming a second photomask with a trim pattern for modifying the patterning of the layer patterned using the first photomask, to extend a dimension of at least one first target pattern to provide at least one circuit feature having a third target pattern with the extended dimension and to reduce a dimension of at least one second target pattern to provide at least one dummy feature having a fourth target pattern with the reduced dimension.

6. The method of claim 5, wherein the first target patterns comprise gate circuit feature patterns, the second target patterns comprise gate dummy feature patterns, the third target pattern comprises at least one of the gate circuit feature patterns with the extended dimension, and the fourth target pattern comprises at least one of the gate dummy feature patterns with the reduced dimension.

7. The method of claim 6, wherein the direction of the extension of the at least one of the gate circuit feature patterns is perpendicular to the direction of the reduction of the at least one of the gate dummy feature patterns.

* * * * *